United States Patent [19]

Yamazaki et al.

[11] Patent Number: 5,365,081
[45] Date of Patent: Nov. 15, 1994

[54] SEMICONDUCTOR DEVICE INCORPORATING THERMALLY CONTRACTED FILM

[75] Inventors: Shunpei Yamazaki, Tokyo; Yasuhiko Takemura, Kanagawa, both of Japan

[73] Assignee: Semiconductor Energy Laboratory Co., Ltd., Kanagawa, Japan

[21] Appl. No.: 858,883

[22] Filed: Mar. 27, 1992

[30] Foreign Application Priority Data

Mar. 27, 1991 [JP] Japan .................... 3-087778

[51] Int. Cl.⁵ ............... H01L 27/01; H01L 27/13; H01L 27/78
[52] U.S. Cl. ............................... 257/67; 257/57; 257/349; 257/351; 257/354; 257/634; 257/650
[58] Field of Search ........... 257/57, 67, 347, 348, 257/349, 350, 351, 352, 353, 354, 634, 650

[56] References Cited

U.S. PATENT DOCUMENTS

| | | | |
|---|---|---|---|
| 4,763,183 | 8/1988 | Ng et al. | 257/347 |
| 4,786,952 | 11/1988 | MacIver et al. | 257/348 |
| 4,875,086 | 10/1989 | Malhi et al. | 257/650 |
| 4,933,298 | 6/1990 | Hasegawa | 257/353 |
| 5,049,968 | 9/1991 | Nakagawa et al. | 357/49 |

Primary Examiner—Ngan Van Ngo
Attorney, Agent, or Firm—Sixbey, Friedman, Leedom & Ferguson

[57] ABSTRACT

A semiconductor device and a method for forming the same. The semiconductor device comprises an insulating or semiconductor substrate, a thermally-contractive insulating film which is formed on said substrate and provided with grooves, and a semiconductor film which is formed on the thermally-contractive insulating film and divided in an islandish form through the grooves. The thermally-contractive insulating film is contracted in a heat process after the semiconductor film is formed.

25 Claims, 7 Drawing Sheets

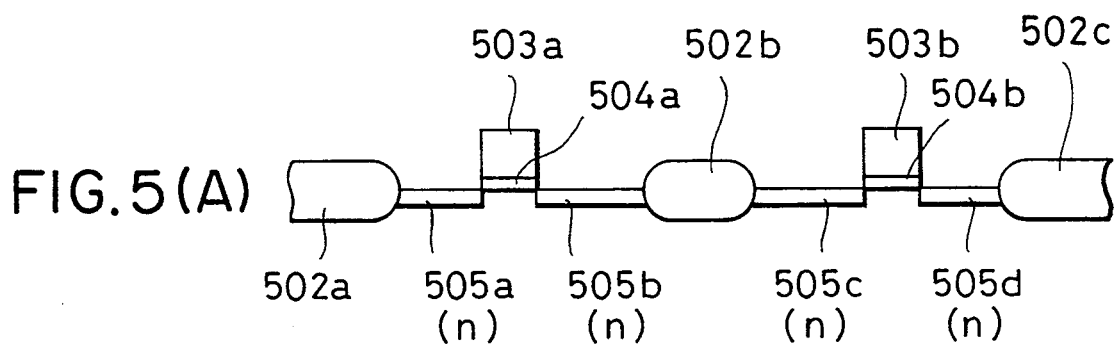
FIG.5(A)
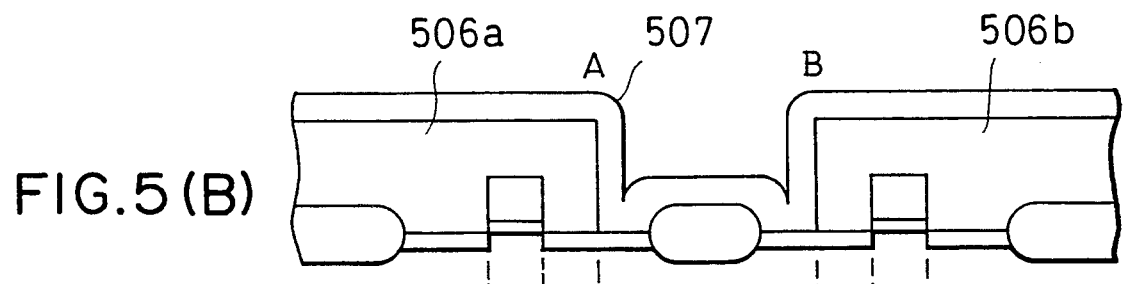
FIG.5(B)
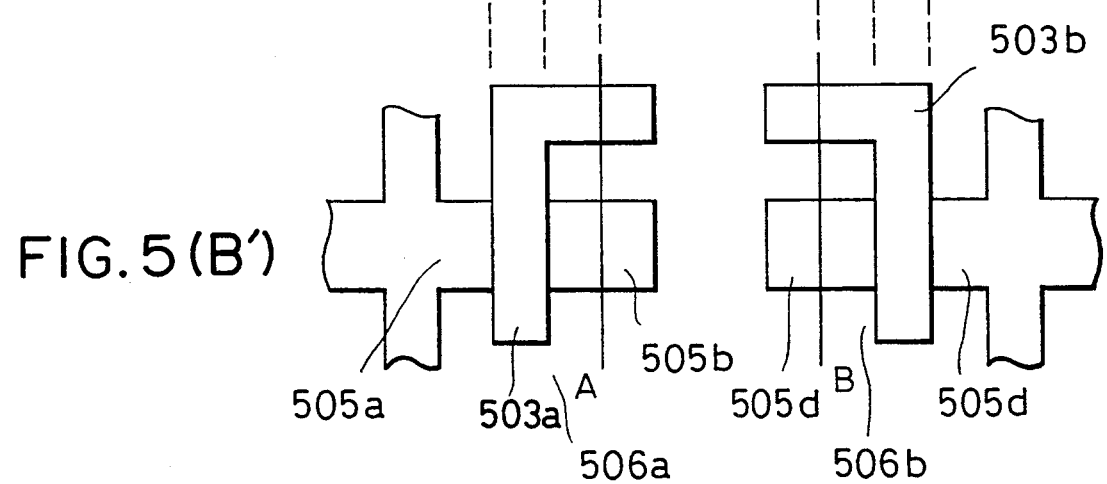
FIG.5(B')

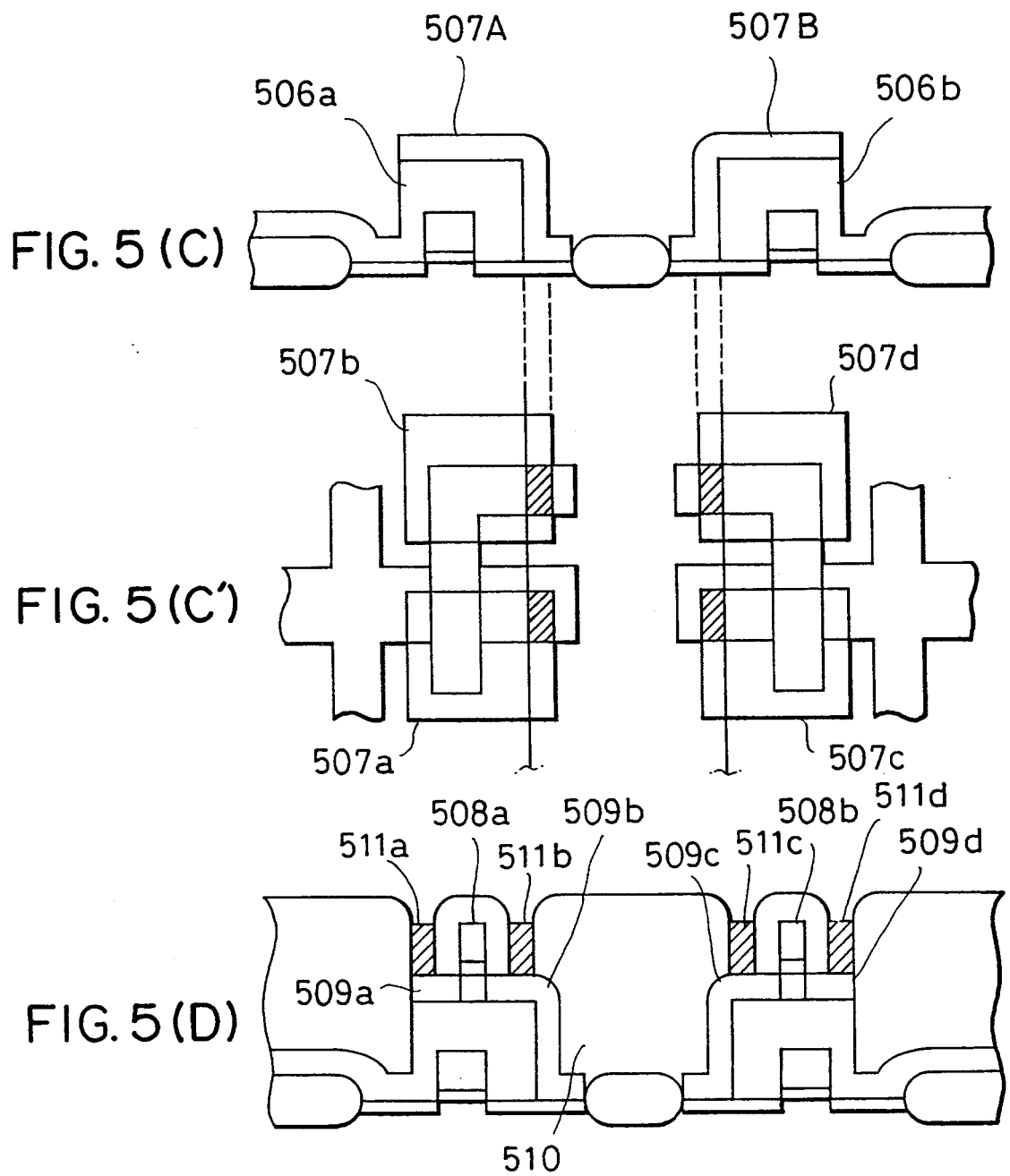

SEMICONDUCTOR DEVICE INCORPORATING THERMALLY CONTRACTED FILM

BACKGROUND OF THE INVENTION

1. Field of the Invention

This invention relates to a thin-film semiconductor element such as a thin film transistor, a thin film diode, etc. for use in a switching element, an integrated circuit, a liquid crystal display element, and so on.

2. Description of Prior Art

A thin film semiconductor element such as a thin film transistor, a thin film diode or the like has been researched and developed as an element which can be formed on an insulating substrate, for example, in a driving circuit for a liquid crystal display device or an amplifier for an image sensor. Likewise, in a monolithic technique in which circuit elements are formed on a semiconductor element or semiconductor substrate, the thin film transistor has been also tentatively used to improve integration of the circuit elements and obtain a cubic structure of the circuit. As a thin-film semiconductor material for the above technique has been adopted polycrystalline material such as Polysilicon, amorphous material such as amorphous silicon, or semi-amorphous semiconductor such as semi-amorphous silicon which is intermediate in material property between the polycrystalline material and the amorphous material and has both of polycrystalline and amorphous properties.

However, the carrier mobility of the thin film semiconductor as described above is remarkably small, for example, one-several to one-several tens of that of monocrystal material, and thus the operating speed of a semiconductor element using the semiconductor materials as described above is also remarkably low. For example, the amorphous silicon has an electron mobility below 1 $cm^2/Vs$, and a general polysilicon has an electron mobility of 10 to 30 $cm^2/Vs$. Even if a special method such as a laser annealing method is adopted, the electron mobility is limited to 200 $cm^2/Vs$ at the maximum, and this value is remarkably small in comparison with 1350 $cm^2/Vs$, the electron mobility of monocrystal silicon. Therefore, the thin film semiconductor element has been mainly used in a relatively-low frequency field or as an auxiliary element for the monocrystal semiconductor such as a load resistance element of a static RAM.

It would be considered as a cause of the low carrier mobility of the thin film semiconductor that a carrier scattering is liable to occur in the amorphous material because the amorphous material has a short crystal periodicity, and the mean free path of carriers becomes shorter. On the other hand, it would be considered for the polycrystalline material that foreign elements are concentrated at grain boundaries and a barrier is liable to occur at the grain boundaries, so that the carriers are randomly scattered at the grain boundaries. On the basis of the above consideration has been made an attempt that each crystal is designed to be larger in size to reduce the number of grain boundaries per unit length, whereby the mobility is increased. The semi-amorphous material mainly comprises a portion having long periodicity as a whole, like the polycrystalline material, and has no distinct grain boundaries, so that the carrier scattering at the grain boundaries is depressed, and a relatively-high mobility is obtained. However, it is difficult to obtain semi-amorphous material having large grain diameter (an area in which an orderly state is kept over a long distance). In addition, polysilicon having large grain diameter is easily obtained, but characteristics of an element is greatly scattered because the size of the element and the grain diameter are in the same dimension. Such an element can not be practically used.

SUMMARY OF THE INVENTION

An object of this invention is to provide a semiconductor material which provides an improved carrier mobility in a thin film semiconductor, and is suitable for a thin film semiconductor element.

The inventors of this application have studied the cause of the increase of the carrier mobility by a laser annealing method. For example, irrespective of the same crystal size of several to ten $\mu m$ order, the electron mobility of 200 $cm^2/Vs$ is obtained by a laser annealing process while the electron mobility of 30 $cm^2/Vs$ is obtained in a heat annealing process using an electric furnace. One of causes of introducing the difference in the electron mobility is guessed to reside in that the heat annealing process requires a long-time annealing to cause the concentration of foreign elements at a grain boundary, while the laser annealing process, particularly the laser annealing process using a pulse laser requires a short-time annealing which is insufficient for the foreign elements to concentrate at the grain boundary, and the barrier formation at the grain boundary is incomplete in the laser annealing process.

In addition to the above cause, it is guessed that the laser annealing process causes a stress occurring in a laser irradiation to be conserved in the material, and any affection is given to the grain boundary by this conserved stress. That is, close junction is made between the grain boundaries by the laser annealing, and the width of a barrier at the grain boundary is shortened.

In order to verify the above guesses, an experiment as shown in FIG. 1 was made. That is, a coating of insulating material which is contracted by heat (having a thermal contractive property), such as phosphosilicate glass, borosilicate glass, phosphoborosilicate glass, AN glass or quartz glass, was formed on a semiconductor substrate 101 by a plasma CVD method or a sputtering method, and then a coating of thin-film semiconductor material such as polysilicon, amorphous silicon or semi-amorphous silicon was further formed on the coating of the contractive insulating coating by the plasma CVD method or the sputtering method. An attention should be given to the difference between the terms of thermal contraction and thermal expansion. The latter has reversibility in a heat cycle, while the former has no reversibility in the heat cycle, that is, has irreversibility in the heat cycle. Therefore, the laminating process using the above materials must be carried out at such a sufficiently low temperature that the thermally-contractive insulating coating is not contracted.

The semiconductor coating and the insulating coating were subjected to a patterning process to form an intermediate as shown in FIG. 1(B). Thereafter, the intermediate was heated at a proper temperature to contract the insulating coating and thus the semiconductor coating on the insulating coating. The contracting temperature is dependent on insulating material of a substrate, and is optimumly about 600° C. for the substrate (coating) of quartz, for example. The amorphous silicon coating is crystallized at 600° C. The intermediate was kept at this state for 24 hours.

Thereafter, in order to neutralize or compensate the disorder of crystal due to the above annealing process, the intermediate was subjected to a heat-annealing at 200° to 400° C. in hydrogen atmosphere to add hydrogen to polysilicon which has been formed through the annealing process. Elements having an MOS-structure was formed using the thin-film semiconductor obtained in the above process to measure the electron mobility thereof, and the electron mobility of 40 to 60 cm$^2$/Vs was obtained as a measured result. In comparison with the electron mobility of the thin-film semiconductor formed on a substrate material having non-contractive property, this mobility was larger by 30 to 100%.

This experimental result is not a direct proof that the laser annealing process provides high mobility, however, it has been incidentally recognized through this experiment that using a special substrate material, the semiconductor coating on the substrate can be supplied with stress, and the mobility thereof can be improved. The inventors of this application have further proceeded with their study on the basis of this recognition, and has implemented this invention.

BRIEF DESCRIPTION OF THE DRAWINGS

FIGS. 5(A), 5(B), 5(B'), 5(C), 5(C'), and 5(D) are further schematic views showing a method for forming a semiconductor element according to this invention.

DETAILED DESCRIPTION OF THE INVENTION

Figure 1:
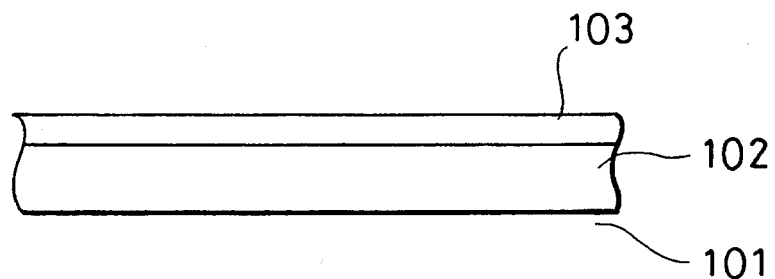
FIGS. 1(A), 1(B) and 1(C) are schematic views showing a method for forming a thin film semiconductor according to this invention.
Figure 1:
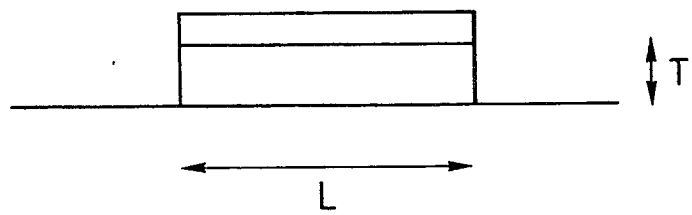
Figure 1:
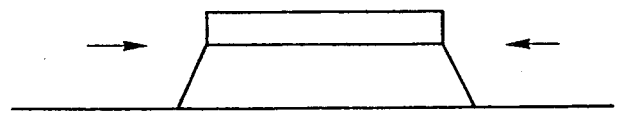

Preferred embodiments of this invention will be described hereunder with reference to the accompanying drawings.

A semiconductor element according to this invention basically comprises a substrate, a thermally-contractive insulating film on the substrate and a semiconductor film on the insulating film. Material of the substrate for the semiconductor element according to this invention may be semiconductor material or insulating material such as glass. When the thermally contractive insulating film serving as a substrate coating film which is formed on the substrate in a subsequent process has a sufficient thickness, affection of the substrate to the substrate coating film is entirely negligible (although this seems to be contradictory). Accordingly, in this case, any material can be used as the substrate. The thermally-contractive insulating material such as material of phosphosilicate glass, borosilicate glass, phosphoborosilicate glass, AN glass or quartz glass is laminated on the substrate by a Photochemical Vapor Deposition (photo-CVD) method, a plasma CVD method or a sputtering method. In the process of forming the thermally-contractive insulating film, a silicon-oxide coating film may be first formed on the substrate, and then phosphorus or boron in concentration of $10^{14}$ to $10^{18}$ cm$^{-2}$, preferably of $10^{16}$ to $5 \times 10^{17}$ cm$^{-2}$, may be doped into the thermally-conductive insulating film by ion implantation. It has been found from the inventors' experiment that if hydrogen of 10 to 30 atom % is doped into the glass material as described above, the thermal contraction is relatively large. The thickness of the thermally-contractive insulating film is preferably 50 to 1000 nm. This thickness is dependent on the thickness of the semiconductor film formed on the thermally-contractive insulating film and the size of circuit elements to be formed in a subsequent process. If the thermally-contractive insulating film is remarkably thin, it is liable to be unintentionally exfoliated from the substrate in its thermal contraction process or not to be contracted due to intensive affection of the substrate thereto. Therefore, the thermally-contractive insulating film should be designed in at least 50 nm thickness.

Thereafter, the semiconductor film such as amorphous silicon, polysilicon or semi-amorphous silicon is formed in 10 to 500 nm thickness. The semiconductor film may contain hydrogen or may contain no hydrogen. The amorphous silicon film may be formed at low temperature, and then subjected to a laser annealing process to polycrystallize the amorphous silicon film. The laser annealing process is preferably used because only the surface portion of the semiconductor film is heated in the laser annealing process, and thus most of the substrate coating film (thermally-contractive film) is not thermally affected. Particularly when a visible light is used as a laser beam, the laser beam is absorbed by the semiconductor film of silicon or the like, but is transmitted through the insulating film, so that the insulating film is not thermally acted by the light. At any rate, it is necessary to form the semiconductor film at such a temperature that the thermally-contractive insulating film is not contracted.

Figure 2A:
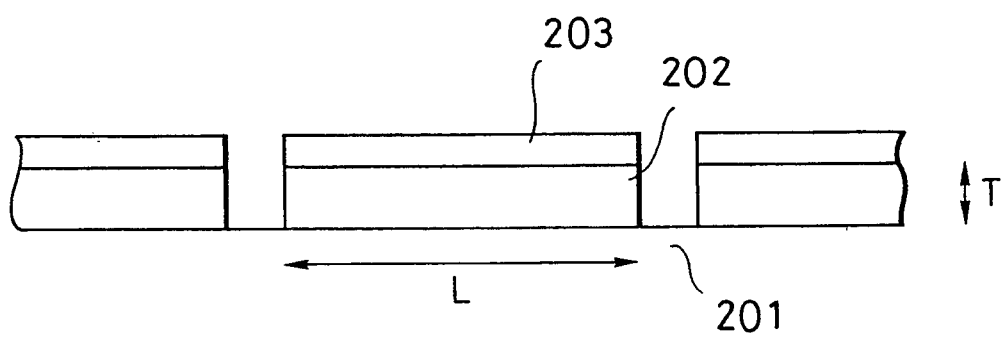
FIGS. 2(A) and 2(B) are further schematic views showing the method according to this invention.
Figure 2B:

Thereafter, the semiconductor film and the insulating film thus formed are subjected to a patterning process. The patterning may be carried out in such a manner that the insulating film is entirely removed as shown in FIG. 2(A), or is removed in a depth (i.e. remains in a thickness) as shown in FIG. 2(B). In both cases, factors of L and T are found to be important, where L represents the width of regions which are separated through grooves formed in the patterning process, and T represents the depth from the interface of the semiconductor film and the insulating film till the bottom of the groove. In this invention, the factors of L and T are required to satisfy the following inequality: $L/T < 1000$, preferably $L/T < 100$. This inequality suggests that when the width of regions is remarkably larger than the thickness of the thermally-contractive insulating film, the thermal contraction proceeds not laterally, but vertically. In this case, the semiconductor film is hardly affected.

Thereafter, the insulating film is contracted in a heating process. The contraction of the insulating and thermally contracted film may be in the range of 30 to 500 parts per million (ppm). The temperature of the heating process is set to 600° to 1000° C. which is a suitable temperature for the insulating film of silicon oxide. Through this process, the semiconductor film is also crystallized. A high-temperature annealing causes occurrence of a number of crystal nucleuses and thus the size of crystals is reduced. In order to avoid this phenomenon, the annealing is first carried out at 500° to 700° C., preferably 550° to 600° C. for 12 to 70 hours (for example, at 580° C. for 36 hours), and then is further carried out at 700° to 1000° C., preferably 750° to 800° C. for 12 to 70 hours (for example, at 780° C. for 24 hours) to thereby contract the insulating film. A non-oxide atmosphere such as argon atmosphere, or a reducing atmosphere such as hydrogen atmosphere is suitable for the heat-annealing process. When the annealing is carried out in a vacuum atmosphere below $10^{-2}$ torr, the thermal contraction is remarkably performed, particularly in the insulating material containing hydrogen. This may be because hydrogen contained in the insulating film is discharged as water to the outside. The increase of the annealing temperature promotes the thermal contraction, but an excessively high annealing temperature is unsuitable because it causes the insulating material to be melted, or to be vitrified and fluidified. Attention should be paid particularly in a case of the insulating materials such as phosphosilicate glass, borosilicate glass and phosphoborosilicate glass because these materials have low glass temperature.

Figure 3A:
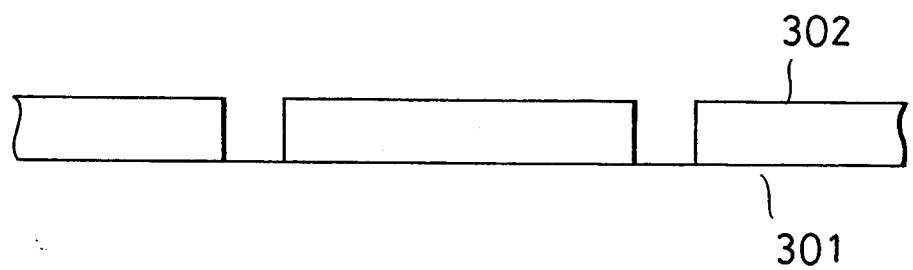
FIGS. 3(A), 3(B) and 3(C) are further schematic views showing the method according to this invention.
Figure 3B:
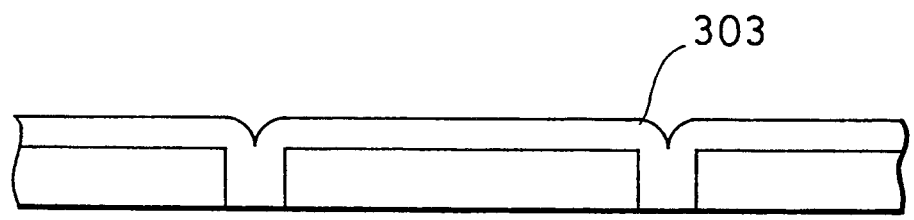
Figure 3C:
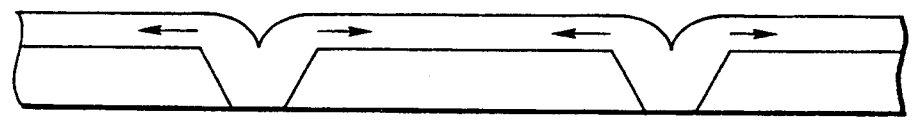
Figure 6A:
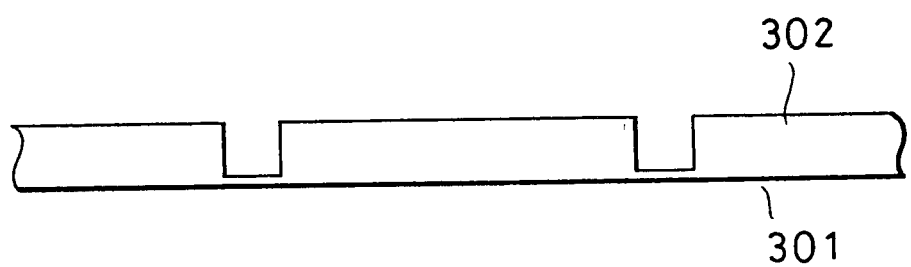
FIGS. 6(A), 6(B) and 6(C are further schematic views showing the method according to this invention.
Figure 6B:
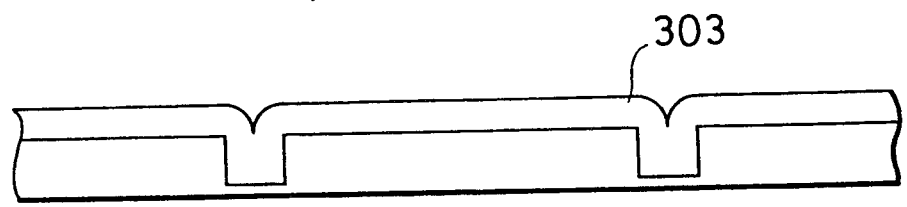
Figure 6C:
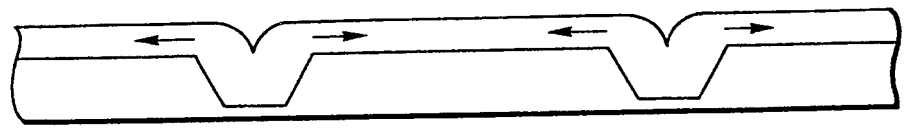

FIG. 6 is a schematic view showing another method of this invention. According to this method, a thermally-contractive insulating film is first formed on an insulating or semiconductor substrate, and then subjected to a patterning process to obtain an intermediate as shown in FIG. 8(A). Thereafter, a semiconductor film is formed on the intermediate to obtain another intermediate as shown in FIG. 8(B), and then subjected to a heat-annealing process to contract the insulating film. In this case, unlike the method as shown in FIGS. 1 and 2, the semiconductor film is not separated or sectioned. FIG. 3 is a schematic view showing a further method of this invention. According to this method, a thermally-contractive insulating film is first formed on an insulating or semiconductor substrate, and then subjected to a patterning process to obtain an intermediate as shown in FIG. 3(A). Thereafter, a semiconductor film is formed on the intermediate to obtain another intermediate as shown in FIG. 3(B), and then subjected to a heat-annealing process to contract the insulating film. In this case, unlike the method as shown in FIGS. 1 and 2, the semiconductor film is not separated or sectioned, and the semiconductor film is directly contacted with the substrate. Therefore, this method is more effective in a case where a part of the semiconductor film is used as a wire, or the semiconductor film is required to be contacted with the semiconductor substrate or the like.

FIG. 4 shows a manufacturing process which contains both of the methods as shown in FIGS. 2 and 3. In this process, at a first step, thermally-contractive insulating materials 402A and 402B are selectively formed on a substrate 401, and a semiconductor film 403 is formed on the thermally-contractive insulating films 402A and 402B. The films 403, 402A and 402B thus formed on the substrate 401 are subjected to an etching process using a patterning technique such as a well-known dry etching or the like to obtain an intermediate as shown in FIG. 4(B). Thereafter, through a heat-annealing process, the insulating films 402a to 402d are contracted, and at the same time the semiconductor films 403a to 403d on the insulating films are stressed to be provided with high mobility.

Figure 4A:
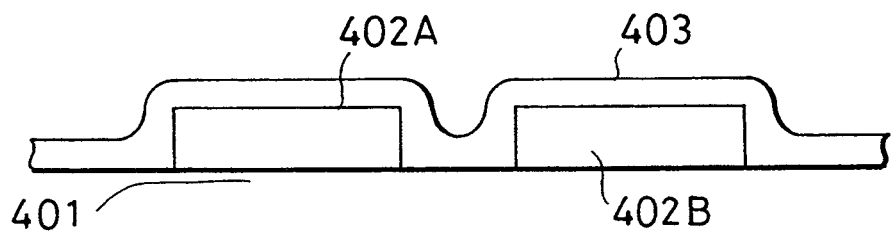
FIGS. 4(A), 4(B), 4(C) and 4(D) show an embodiment of a semiconductor element using the thin film semiconductor forming method of this invention and the semiconductor formed in the same method.
Figure 4B:
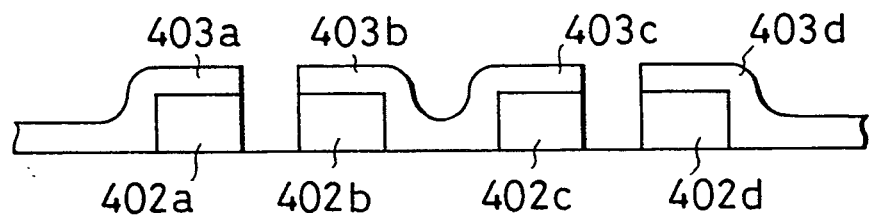
Figure 4C:
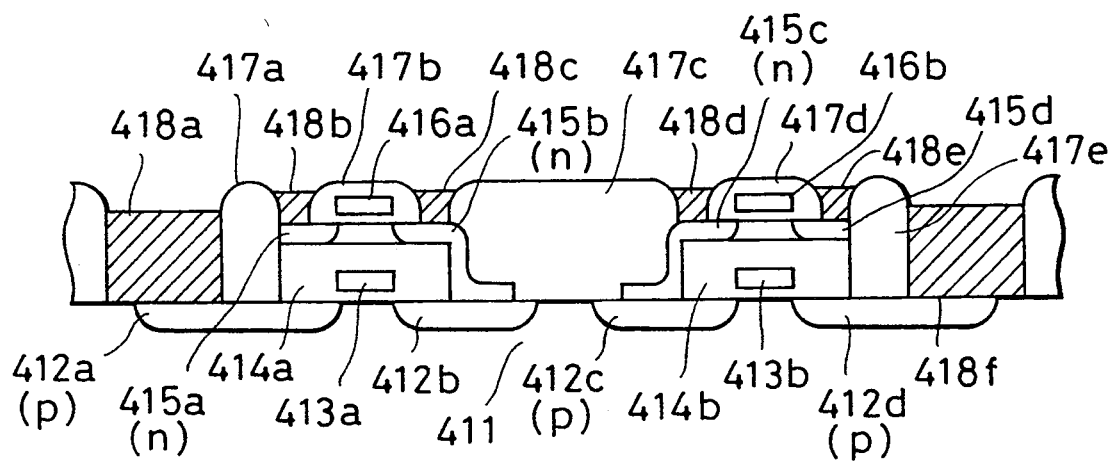

FIG. 4(C) shows a semiconductor element which is formed in the above process. This semiconductor element is a complementary MOS (CMOS) comprising thin film transistors. In this semiconductor element, p-type impurity regions 412a to 412c are formed on a monocrystal semiconductor substrate 411, and semiconductor gate electrodes 413a and 413b are provided. The semiconductor gate is generally formed of n-type semiconductor containing phosphorus. Thermally-contractive insulating film 414a and 414b are formed on the semiconductor gates 413a and 413b, and semiconductor films having an n-type semiconductor impurity region are formed on the thermally-contractive insulating films 414a and 414b. Parts 415b and 415c of the n-type semiconductor regions are contacted with the p-type semiconductor region on the substrate. Therefore, PN junction is made at the interface between the p-type and n-type regions 412b and 415b, or between the p-type and n-type regions 412c and 415c, however, a rectifying capability is hardly obtained if both of the p-type and n-type regions are sufficiently doped with impurities, and thus both regions are degenerate semiconductors. On these semiconductor regions are formed semiconductor gates 416a and 416b. In addition, interlayer insulating films 417a to 417e are formed, and metal electrodes such as aluminum, aluminum-silicon alloy, tungsten, molybdenum or alloy of silicon and each of the above metals are formed after a hole-forming process.

As described above, the semiconductor element is so designed that the thin-film semiconductor region is contacted with the semiconductor substrate, so that an electrode formation can be easily performed.

Figure 4D:
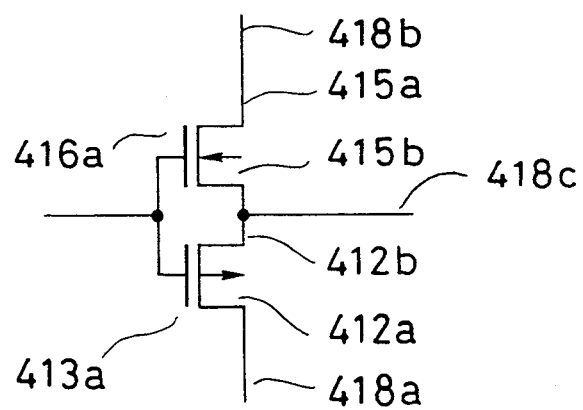

FIG. 4(D) is a circuit diagram showing a circuit element at the left side of FIG. 4(C). When the element has a multi-layer structure as shown in FIG. 4(C), the holes must be deeply formed to form the electrodes. In addition, in order to perform an accurate contact through the deep hole, the area of the deep hole is required to be sufficiently large as shown by reference numerals 418a and 418f of FIG. 4(C) because an electrode-forming material is attached to the side wall of the hole and the hole is liable to be closed without coating the deep portion of the inside of the hole. In this case, the accurate contact is not performed. However, for example, the electrode 418b is relatively shallow, so that the area at which the electrodes are formed can be reduced.

In the semiconductor element having the multi-layer structure, it is undesirable that the contact hole is formed so as to reach the semiconductor substrate, and a contact with a wiring of the uppermost layer or layer near thereto is made. Accordingly, in the case as shown in FIG. 4(C), in place of provision of the electrodes 418a and 418f, the impurity regions 412a and 412d are practically designed so as to serve as a wiring. In this case, the contact with the impurity regions is not necessary, and thus the area of the element is sufficiently smaller than that of FIG. 4(C).

The following embodiments of the semiconductor element were representatively produced in the method as described above, and will be described in detail.

Embodiment 1

An n-channel type MOS FET as shown in FIG. 5 (A) was formed on a p-type monocrystal silicon substrate 501 having resistivity of $10^3$ (ohm cm) using a conventional integrated circuit producing technique. That is, reference numerals 502a to 502c represent element separating regions (or field insulating members) each of which comprised a thick oxide film and were formed by a so-called LOCOS technique or other similar techniques, and reference numerals 503a and 503b represent gate electrodes of 200 nm thickness which were formed on gate insulating films 504a and 504b of 10 nm thickness, and comprised n-type silicon doped with phosphorus of about $10^{21}$ atoms·cm$^{-3}$. As shown in FIG. 5(B'), each of the gate electrodes was of an L-shape. Reference numerals 505a to 505d represent impurity regions which were formed with self-alignment using the field insulating members and the gate electrodes as masks, and contained impurities of phosphorus of $3\times10^{20}$ atoms·cm$^{-3}$ and arsenic of $1\times10^{20}$ atoms·cm$^{-3}$. Further, as shown in FIG. 5(B'), the impurity regions 505a and 505d were electrically connected to other elements formed on the semiconductor substrate and a power source. The width of the gate electrode was 1 μm. The length of the impurity regions in a source-drain direction was about 5 μm, and the channel width thereof was 3 μm.

Subsequently, a silicon-oxide film of 500 nm thickness is laminated by a glow-discharge plasma CVD method. The method of forming the silicon-oxide film will be briefly described below.

Monosilane gas (SiH$_4$) and hydrogen gas were used as raw gas, and the monosilane was decomposed by a high-frequency (13.56 MHz) discharge. A pressure in a chamber at a reaction process was set to 0.1 torr, and the substrate was cooled at room temperature or by liquid nitrogen to decrease the substrate temperature. The hydrogen amount doped in the silicon-oxide film thus formed was measured to be about 30 atom % by various measurements. The silicon-oxide film thus formed was subjected to an etching process by a well-known dry etching technique to form silicon-oxide film regions 506a and 506b. Disilane gas (Si$_2$H$_6$) may be used in place of monosilane gas.

Thereafter, an amorphous silicon film 507 of 200 nm thickness was formed over the silicon-oxide regions by the sputtering method. The substrate temperature was set to the room temperature, a silicon target of 99.99999% in purity was used as a sputter target, and the atmosphere in the sputtering process was 100% argon atmosphere under 0.2 torr. Further, a consumed power used for the sputtering process was 200 W at high frequency of 13.56 MHz. Through the above processes, an element as shown in FIGS. 5(B) and 5(B') was obtained.

Subsequently, the silicon film 507 and the silicon-oxide films 506a and 506b were selectively removed by the well-known etching technique. FIG. 5(C') is a top view of the element which has been subjected to this etching process. An oblique line portion of FIG. 5(C') represents a portion where the silicon film was contacted with the substrate or the gate electrode to form a contact. In this case, the silicon oxide film is left unremoved in 200 nm thickness. Thereafter, the substrate was heated to 600° C. at $10^{-5}$ torr, and this condition was kept for 70 hours. Further, the temperature was gradually increased to 800° C. for two hours with keeping the above condition, and this condition was kept for three hours. Through this process, the crystallization of the amorphous silicon and the thermal contraction of the insulating film were induced.

Thereafter, the surface of the silicon film 507 was exposed to a dried oxygen atmosphere of high temperature to form a thermally oxidated film having about 10 nm thickness. This oxidated film was used as a gate insulating layer later. Portions of the oxidated film which were formed on the silicon films 507b and 507d as shown in FIG. 5(C') were removed to expose the silicon films under the removed oxidated film to the outside, and polycrystalline silicon films were formed on the exposed silicon films by a thermal decomposition of silane. The polycrystalline silicon was added with phosphorus of about $10^{20}$ to $10^{21}$ atoms·cm$^{-3}$ to have good conductivity. The polycrystalline silicon film was selectively removed to form gate electrodes 508a and 508b. The gate electrodes 508a and 508b were contacted with the silicon films 507b and 507d in the regions 507b and 507d, and thus were contacted with the gate electrodes 503a and 503b.

Further, boron ion of $10^{14}$ to $10^{15}$ cm$^{-2}$ was doped by the ion implantation. Thereafter, the annealing was carried out in vacuum at 1000° C. for a half hour to recrystallize an amorphous region which had been formed by the ion implantation, thereby forming p-type impurity regions 509a to 509d. In addition, phosphoborosilicate glass was formed on the surface of the element, and the surface thereof was smoothed by a reflow technique to form an interlayer insulating film 510. Further, electrode-forming holes were formed, and aluminum electrodes 511a to 511d were formed in the holes. Through the above processes, a CMOS comprising thin-film transistors having a multi-layer structure as shown in FIG. 5(D) was formed. The hole mobility of the thin-film transistor (p-channel type) was 50 to 100 cm$^2$/Vs, and thus the characteristic of the transistor was improved more by two times than that of a conventional thin-film transistor.

Embodiment 2

An n-type MOSFET as shown in FIG. 5(A) was formed on a p-type monocrystal silicon substrate 501 having resistivity of 10 (ohm cm) by a conventional integrated circuit producing technique. The details of an element of this example had the same size as those of the embodiment 1. Further, a silicon-oxide film of 500 nm thickness was laminated by the glow-discharge plasma CVD method. This process was substantially the same as that of the embodiment 1, except that phosphine (PH$_3$) of 1000 ppm to 20% was mixed to the raw gas. Therefore, the film thus obtained contained phosphorus. The hydrogen amount contained in the silicon-oxide film was 30 atom % like the embodiment 1. The silicon-oxide film containing phosphorus was subjected to the etching process by a well-known dry etching technique to form silicon-oxide regions 506a and 506b. Subsequently, an amorphous silicon film 507 of 200 nm thickness was formed on the silicon-oxide regions 506a and 506b by the sputtering method. The film forming condition of this embodiment was identical to that of the embodiment 1. Through the above processes, an intermediate element as shown in FIGS. 5(B) and 5(B') was obtained.

The silicon film 507 and the silicon-oxide films 506a and 506b were selectively removed by the well-known etching technique. FIG. 5(C') is a top view of the intermediate element obtained in the etching process. In figure, an oblique line portions represent areas where the silicon film is contacted with the substrate or the gate electrodes thereunder. In this case, the silicon-oxide film was left unremoved in 20 nm thickness. Thereafter, the substrate was left in $10^{-6}$ torr vacuum, and irradiated with excimer laser beam (KrF laser, wavelength: 248 nm, pulse width: 30 nsec: 200 mJ/pulse, 50 shots). The amorphous silicon film was crystallized in this process. Subsequently, the intermediate element was kept at 700° C. for 12 hours in vacuum. The thermal contraction was induced in the insulating film in this process. In addition, the intermediate element was kept at 200° to 600° C. for three hours in hydrogen atmosphere to be subjected to a hydrogen-passivation treatment, thereby improving electrical characteristics of silicon.

Thereafter, the surface of the silicon film 507 was exposed to a dried high-temperature oxygen atmosphere to form a heat-oxidated film of about 10 nm thickness. This oxidated film was used as a gate insulating layer later. Portions of the oxidated film which were formed on the silicon films 507b and 507d as shown in FIG. 5(C') were removed to expose the silicon films under the removed oxidated film to the outside, and polycrystalline silicon films of 300 nm thickness were formed on the exposed silicon films by a thermal decomposition of silane. The polycrystalline silicon was added with phosphorus of about $10^{20}$ to $10^{21}$ atoms·cm$^{-3}$ to have good conductivity. The polycrystalline silicon films were selectively removed to form gate electrodes 508a and 508b. The gate electrodes 508a and 508b were contacted with the silicon films 507b and 507d in the regions 507b and 507d, and thus were contacted with the gate electrodes 503a and 503b.

Further, boron ion of $10^{14}$ to $10^{15}$ cm$^{-2}$ was doped by the ion implantation. Thereafter, the annealing was carried out in vacuum at 1000° C. for a half hour to recrystallize an amorphous region which had been formed by the ion implantation, thereby forming p-type impurity regions 509a to 509d. In addition, phosphoborosilicate glass was formed on the surface of the element, and the surface thereof was smoothed by a fellow technique to form an interlayer insulating film 510. Further, electrode-forming holes were formed, and aluminum electrodes 511a to 511d were formed in the holes. Through the above processes, a CMOS comprising thin-film transistors having a multi-layer structure as shown in FIG. 5(D) was formed. The hole mobility of the thin-film transistor (p-channel type) was 150 to 200 cm$^2$/Vs, and thus the characteristic of the transistor was improved more above two times than that of a conventional thin-film transistor.

Embodiment 3

An n-type MOSFET as shown in FIG. 5(A) was formed on a p-type monocrystal silicon substrate 501 having resistivity of 10 (ohm cm) by a conventional integrated circuit producing technique. The details of an element of this example had the same size as those of the embodiment 1. Further, a silicon-oxide film of 500 nm thickness was laminated by the glow-discharge plasma CVD method. This process was substantially the same as that of the embodiment 1, except that phosphine of 1000 ppm to 20% was mixed to the raw gas. Therefore, the film thus obtained contained phosphorus. The hydrogen amount contained in the silicon-oxide film was 30 atom % like the embodiment 1. The silicon-oxide film containing phosphorus was subjected to the etching process by a well-known dry etching technique to form silicon-oxide regions 506a and 506b. Subsequently, an amorphous silicon film 507 of 200 nm thickness was formed on the silicon-oxide regions 506a and 506b by the sputtering method. The film forming condition of this embodiment was identical to that of the embodiment 1. Through the above processes, an intermediate element as shown in FIGS. 5(B) and 5(B') was obtained.

The silicon film 507 and the silicon-oxide films 506a and 506b were selectively removed by the well-known etching technique. FIG. 5(C') is a top view of the intermediate element obtained in the etching process. In figure, oblique line portions represent areas where the silicon film is contacted with the substrate or the gate electrodes thereunder. In this case, the silicon-oxide film was left unremoved in 20 nm thickness. Thereafter, the substrate was left in $10^{-6}$ torr vacuum, and irradiated with excimer laser beam (KrF laser, wavelength: 248 nm, pulse width: 30 nsec: 100 mJ/pulse, 50 shots). The amorphous silicon film was changed to the semi-amorphous film in this process. The semi-amorphous state was confirmed by Raman Spectroscopy. Subsequently, the intermediate element was kept at 600° C. for 72 hours in vacuum. The thermal contraction was induced in the insulating film in this process. In addition, the intermediate element was kept at 200° to 400° C., for example 300° C. for a half hour, in hydrogen atmosphere (for example, a mixed gas of 20% hydrogen and 80% argon, 1 atm) to be subjected to a hydrogen-passivation treatment, thereby improving electrical characteristics of semi-amorphous silicon.

Thereafter, a silicon-oxide film of about 100 nm thickness was formed on the silicon film 507 by the glow-discharge method. This oxide film was used as a gate insulating layer later. Portions of the oxide film which were formed on the silicon films 507b and 507d as shown in FIG. 5(C') were removed to expose the silicon films under the removed oxide film to the outside, and polycrystalline silicon films of 300 nm thickness were formed on the exposed silicon films by a thermal decomposition of silane. The polycrystalline silicon was added with phosphorus of about $10^{20}$ to $10^{21}$ atoms·cm$^{-3}$ to have good conductivity. The polycrystalline silicon films were selectively removed to form gate electrodes 508a and 508b. The gate electrodes 508a and 508b were contacted with the silicon films 507b and 507d in the regions 507b and 507d, and thus were contacted with the gate electrodes 503a and 503b.

Further, boron ion of $10^{14}$ to $10^{15}$ cm$^{-2}$ was doped by the ion implantation. Thereafter, the annealing was carried out in vacuum at 600° C. for a half hour to recrystallize an amorphous region which had been formed by the ion implantation, thereby forming p-type impurity regions 509a to 509d. In addition, phosphoborosilicate glass was formed on the surface of the element, and the surface thereof was smoothed by a reflow technique to form an interlayer insulating film 510. Further, electrode-forming holes were formed, and aluminum electrodes 511a to 511d were formed in the holes. Through the above processes, a CMOS comprising thin-film transistors having a multi-layer structure as shown in FIG. 5(D) was formed. The hole mobility of the thin-film transistor (p-channel type) was 130 to 150 cm$^2$/Vs, and thus the characteristic of the transistor was improved more above two times than that of a conventional thin-film transistor. In addition, the dispersion of the mobility of the elements was small.

According to this invention, the carrier mobility of the thin film semiconductor can be improved. The improvement degree is 20 to 100% with respect to the prior art, however, the improvement degree of three times can be obtained in a special case. In this embodiment, the electron mobility is not described, however, the same effect is also obtained for the electron mobility using the same manufacturing method as described above. Further, in this embodiment, silicon is mainly used as a semiconductor material, however, this invention is not limited to silicon. The same phenomenon and effect as described above are also confirmed in a case where germanium or compound semiconductor material such as silicon germanium alloy is used as the semiconductor material.

The embodiments as described above are described particularly in a case where the semiconductor material is used for the substrate, however, an insulating substrate can be also used as described above. Further, the embodiments as described above have only a double-layer structure that a first-layer transistor is formed on the semiconductor substrate, and a second-layer thin film transistor is formed on the first-layer transistor, however, may have another type structure. For example, the following triple-layer structure may be implemented. A first-layer transistor is formed on the semiconductor substrate, and a first thin film transistor serving as a second-layer transistor is formed on the first-layer transistor in the method of this invention. Further, a thermally-contractive material is formed on the first thin film transistor serving as a substrate, and a second thin film transistor serving as a third-layer transistor is formed on the thermally-contractive material. As another structure, first and second thin film transistors may laminated in this order on the insulating substrate to form a double-layer structure element on the insulating substrate. The former is used to improve integration density of a semiconductor integrated circuit, and the latter is used to decrease semiconductor element areas and increase light-transmissible areas in a liquid crystal display element or the like.

What is claimed is:

1. A semiconductor device comprising:
an insulating and thermally contracted film provided on a surface; and
a semiconductor film island provided on said insulating and thermally contracted film, functioning at least as a channel region of said device,
wherein said insulating and thermally contracted film is contracted by heating after the formation of said semiconductor film island thereon.

2. The device of claim 1 wherein said semiconductor film island is forced to contract by the contraction of said insulating and thermally contracted film.

3. The device of claim 1 wherein said contraction of said insulating and thermally contracted film is in the range of 0–500 ppm.

4. The device of claim 1 wherein a groove is formed within said insulating and thermally contracted film.

5. The device of claim 4 wherein said groove is formed by removing a part of said film in order that a surface of said substrate is not exposed to said groove.

6. A semiconductor device comprising:
a heat-contracted insulating film formed on a surface, having a thickness of 50–1000 nm; and
a semiconductor film formed on said insulating film, having a thickness of 10–500 nm and functioning as at least a channel region of said device.

7. The device of claim 6 wherein said glass is selected from the group consisting of phosphosilicate glass, borosilicate glass and a quartz.

8. The device of claim 6 wherein a groove is formed within said insulating film.

9. A semiconductor device comprising:
a heat-contracted insulating film formed on a surface, having a thickness of 50–1000 nm and having a groove formed therein; and
a semiconductor film formed on said insulating film having a thickness of 10–500 nm and functioning at least as an active region of said device;
wherein said groove is formed by removing a part of said insulating film in order that a surface of said substrate is not exposed to said groove.

10. A semiconductor device comprising:
a substrate having thereon a plurality of insulating islands separated from one another and comprising a heat-contracted insulating film, respectively:
a semiconductor layer formed on said insulating islands, functioning as at least a channel region of said device,
wherein said heat-contracted insulating film is contracted by heating after the formation of said semiconductor layer.

11. The device of claim 10 wherein said semiconductor layer extends over some of said islands so that said semiconductor layer directly contacts with said substrate at a gap between adjacent ones of said islands.

12. The device of claim 10 wherein said semiconductor layer has a thickness of 10–500 nm and said insulating layer has a thickness of 50–1000 nm.

13. The device of claim 10 wherein a thickness "T" and a width "L" of said insulating islands satisfies $L/T < 1000$.

14. A semiconductor device comprising:
a substrate having thereon a plurality of insulating islands separated from one another and comprising a heat-contracted insulating film having a heat contraction in the range of 30–500 ppm, respectively; and
a semiconductor layer formed on said insulating islands and functioning as at least a channel region of said device.

15. The device of claim 14 wherein said glass is selected from the group consisting of phosphosilicate glass, borosilicate glass and a quartz.

16. A semiconductor device comprising:
a substrate having thereon a plurality of insulating islands separated from one another and comprising a heat-contracted insulating film, respectively;
a plurality of semiconductor islands separated from one another and formed on said insulating islands, respectively, where each of said semiconductor islands function as at least a channel of said device,
wherein said heat-contracted insulating film is contracted by heating after the formation of said semiconductor layer.

17. The device of claim 16 wherein said heat contracted insulating film comprises a glass selected from the group consisting of phosphosilicate glass, borosilicate glass and a quartz.

18. A semiconductor device comprising:
an insulating and thermally contracted film provided on a surface; and
a semiconductor film island provided on said insulating and thermally contracted film with a groove formed therein,
wherein said insulating and thermally contracted film is contracted by heating after the formation of said semiconductor film island thereon, and
wherein said groove is formed by removing a part of said insulating and thermally contracted film in order that a surface of said substrate is not exposed to said groove.

19. A semiconductor device comprising:
a heat-contracted insulating film comprising glass and formed on a surface having a groove formed therein; and
a semiconductor film formed on said insulating film,
wherein said groove is formed by removing a part of said insulating film in order that a surface of said substrate is not exposed to said groove.

20. The device of claim 1 wherein said insulating and thermally-contracted film contains 10 to 30 atom % hydrogen prior to the heat contraction thereof.

21. The device of claim 6 wherein said heat-contracted film contains 10 to 30 atom % hydrogen prior to the heat contraction thereof.

22. The device of claim 16 wherein said heat-contracted film contains 10 to 30 atom % hydrogen prior to the heat contraction thereof.

23. The device of claim 6 wherein said heat contracted insulating layer comprises glass.

24. The device of claim 9 wherein said heat contracted insulating layer comprises glass.

25. The device of claim 14 wherein said heat contracted insulating layer comprises glass.

* * * * *

UNITED STATES PATENT AND TRADEMARK OFFICE
CERTIFICATE OF CORRECTION

PATENT NO.    : 5,365,081
DATED         : November 15, 1994
INVENTOR(S)   : Shunpei Yamazaki et al.

It is certified that error appears in the above-identified patent and that said Letters Patent is hereby corrected as shown below:

Column 11,
Line 52, delete "6" and insert -- 23 --.

Column 12,
Line 29, delete "14" and insert -- 25 --.

Signed and Sealed this

Thirtieth Day of April, 2002

*Attest:*

*Attesting Officer*

JAMES E. ROGAN
*Director of the United States Patent and Trademark Office*